United States Patent [19]

Asai et al.

[11] Patent Number: 5,044,069
[45] Date of Patent: Sep. 3, 1991

[54] DEVICE FOR SUPPLYING ELECTRICAL COMPONENTS HAVING TWO CARRIERS FOR FEEDING THREE OR MORE COMPONENT SUPPLY TABLES

[75] Inventors: Koichi Asai, Nagoya; Mamoru Tsuda, Okazaki; Yasuo Muto, Chiryu; Jiro Kodama, Nagoya, all of Japan

[73] Assignee: Fuji Machine Mfg. Co., Ltd., Aichi, Japan

[21] Appl. No.: 575,637

[22] Filed: Aug. 31, 1990

[30] Foreign Application Priority Data

Sep. 5, 1989 [JP] Japan ................................. 1-229604

[51] Int. Cl.⁵ .............................................. H05K 3/30
[52] U.S. Cl. ...................................... 29/740; 29/741; 29/771; 29/822; 198/365
[58] Field of Search ................. 29/740, 741, 822, 785, 29/786, 771; 198/365, 370

[56] References Cited

U.S. PATENT DOCUMENTS 4,694,570  9/1987  Rudolph et al. ........................ 29/740
4,914,808  4/1990  Okumura et al. ...................... 29/740

FOREIGN PATENT DOCUMENTS 3344483  3/1988  Fed. Rep. of Germany .
62-21300  1/1987  Japan .
62-140499  6/1987  Japan .
63-98185   4/1988  Japan .
63-269600  11/1988 Japan .

Primary Examiner—Carl E. Hall
Attorney, Agent, or Firm—Oliff & Berridge

[57] ABSTRACT

A component supply device for supplying a component mounting device with electronic components at a supply position, which includes at least three supply tables each having a plurality of supply units mounted thereon such that the supply units have respective supply portions which are spaced from each other along a predetermined line, the supply units holding respective groups of electronic components of respective different kinds, a guiding device for guiding the supply tables such that the supply tables are movable in a moving direction parallel to the predetermined line, and a table positioning device for positioning the supply tables in the moving direction so that the supply portions of the supply units are selectively brought to the supply position. The table positioning device includes a first and a second carrier which are selectively engageable with the supply tables and which are reciprocable in the moving direction without an interference with each other to move the supply tables along the guiding device, and a first and a second feeding device for moving the first and second carriers, respectively.

13 Claims, 11 Drawing Sheets

FIG.5i
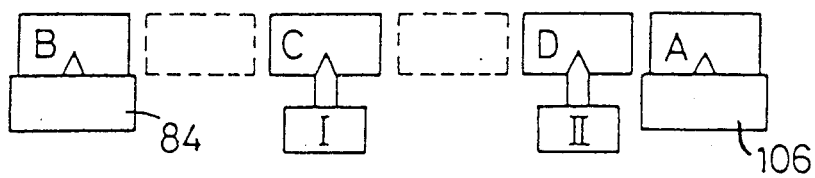
FIG.5j
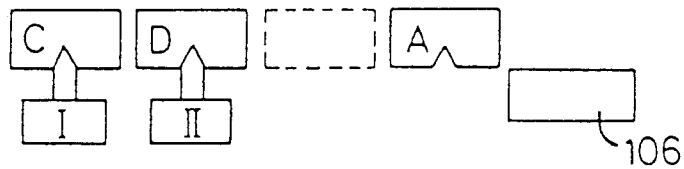
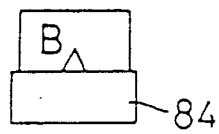
FIG.5k
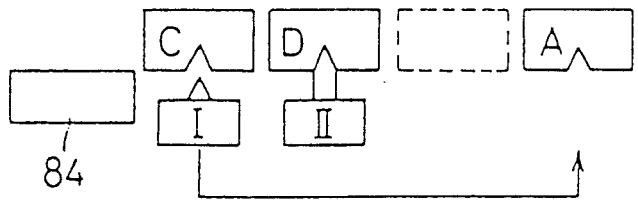
FIG.5l
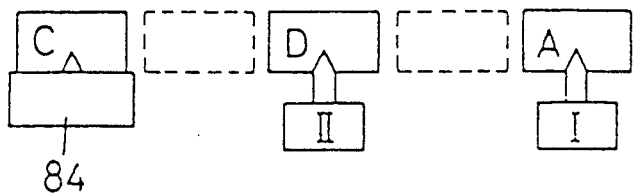
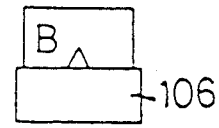

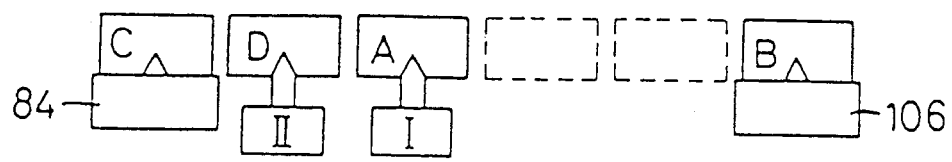
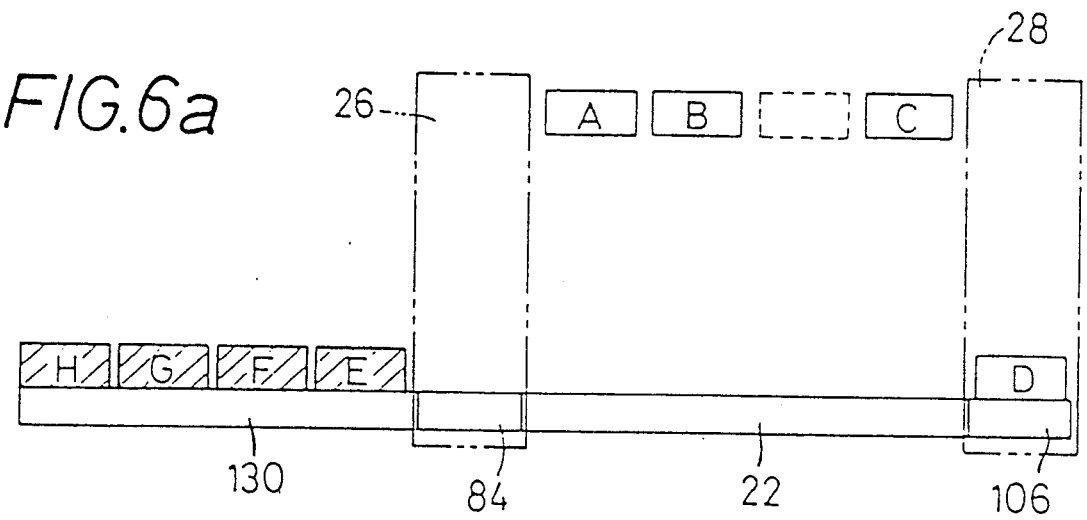
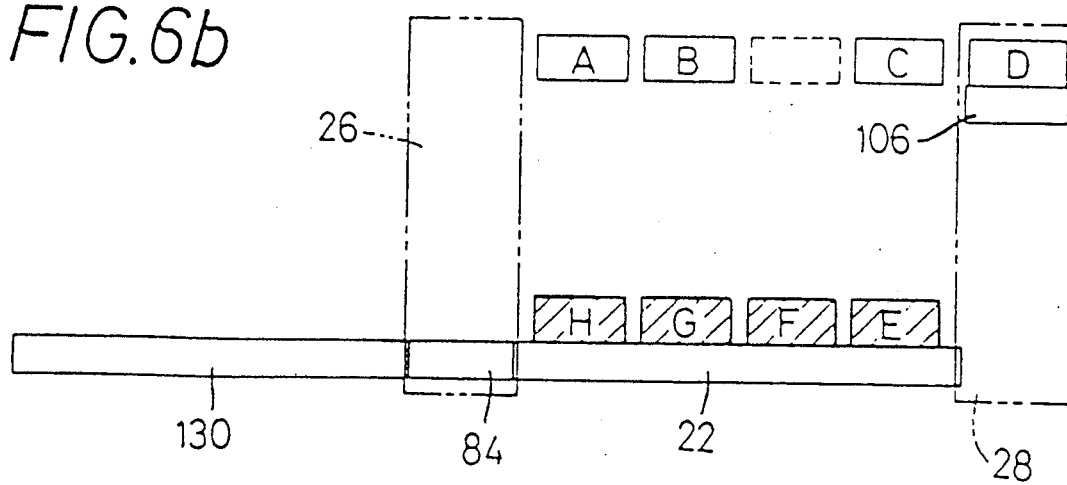

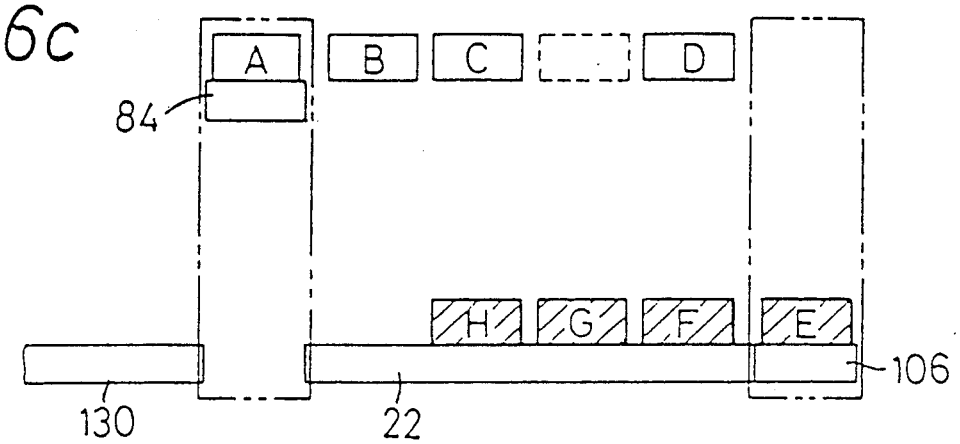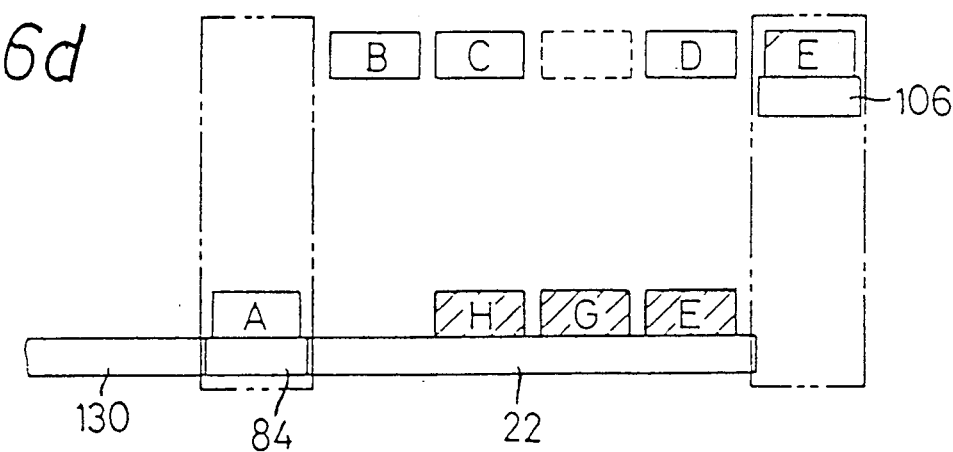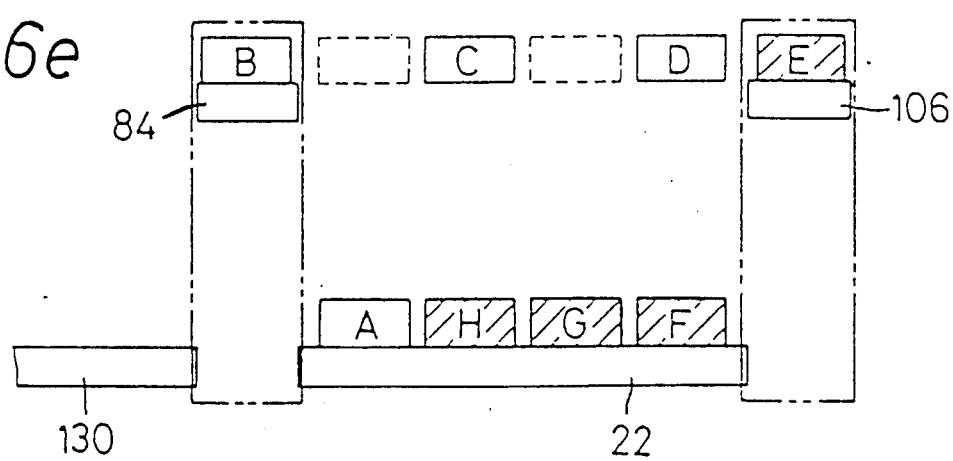

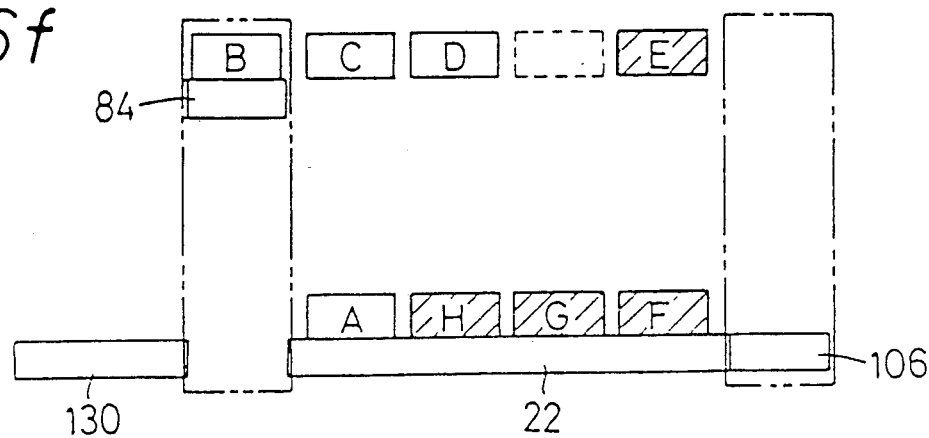
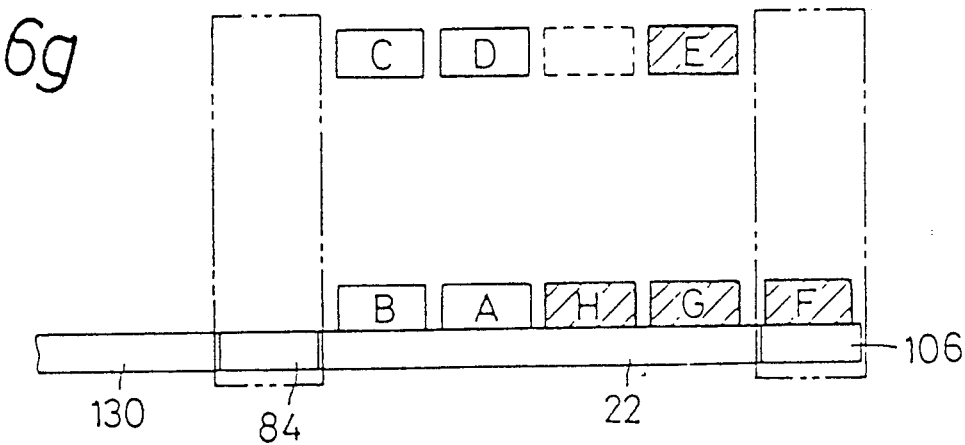
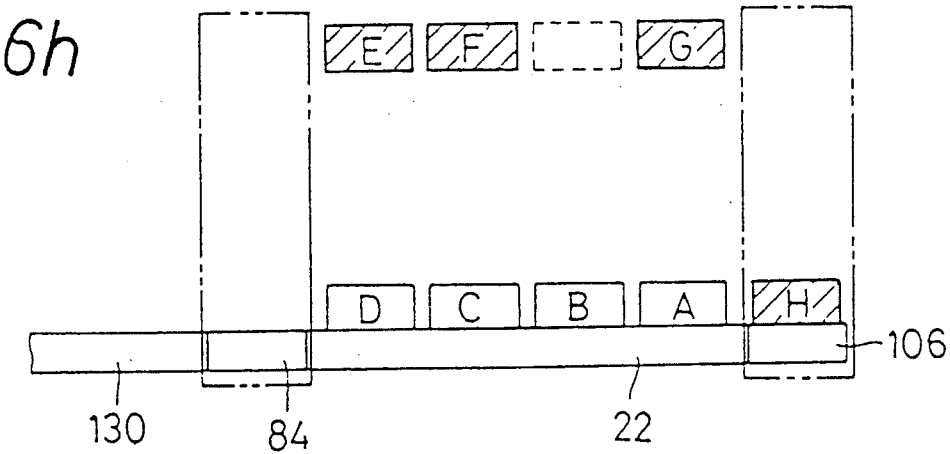

DEVICE FOR SUPPLYING ELECTRICAL COMPONENTS HAVING TWO CARRIERS FOR FEEDING THREE OR MORE COMPONENT SUPPLY TABLES

BACKGROUND OF THE INVENTION

1. Field of the Invention

The present invention relates to a component supply device for supplying electronic components to a component mounting device which operates to place the received components on a desired article, and more particularly to such a component supply device which is capable of supplying the electronic components with improved efficiency.

2. Discussion of the Prior Art

A known component supply device is provided with a plurality of supply units for storing or holding electronic components to be supplied, and at least one supply table on which the supply units are mounted. These supply units on the table(s) are spaced from each other along a single line, such as a straight line or an arcuate line, and the table(s) is/are positioned to move the supply units along this line so as to supply the electronic components one by one to a component mounting device. The component supply device of the above type includes (a) at least one supply table having a plurality of supply units mounted thereon, each supply unit holding a multiplicity of electronic components of one kind and having a supply portion at which the components are picked up by a component mounting device, the supply portions of the units being spaced from each other along a line, (b) guiding means for guiding the supply table or tables along the above-indicated line, such that the supply table or tables is/are movable in a direction parallel to the line, (c) positioning means for feeding and positioning the supply table or tables in the direction parallel to the line, so that the supply portions of the supply units are successively and selectively brought to a supply position at which the electronic components are transferred to the component mounting device. An example of this type of supply device is disclosed in laid-open Publication No. 63-269600 of unexamined Japanese Patent Application. The supply device as disclosed in this publication has two supply tables, and a table guide device serving as the guiding means, which extends over an operation area where the supply tables supply the electronic components to the mounting device, and a first and a second shunting area provided on the opposite sides of the operation area. The table positioning means used in the supply device includes a carrier operatively connected to a feed screw, a drive motor for driving the feed screw, and a device for selectively connecting or disconnecting to or from a selected one of the two supply tables. In this arrangement, the two supply tables are successively or concurrently used for supplying the electronic components. If the component supply device employs two supply tables, as in the disclosed supply device, the electronic components to be supplied are divided into two groups, each group being mounted on the corresponding one of the two supply tables. This arrangement is advantageous when a lot of supply units are necessary for supplying many kinds of or a large number of electronic components, since each one of the supply tables can be relatively small-sized, as compared with where only one supply table is employed. Such small-sized supply tables can be moved at a relatively high speed with an excellent response, by using a drive motor having a relatively small capacity or driving force, permitting the supply device to efficiently supply the components.

As described above, the component supply device as disclosed in the above-identified publication is provided with only one carrier for feeding the two supply tables. In the case where the two supply tables are successively used, and these two supply tables take turns supplying the electronic components, one of the supply tables which has been used is moved by the carrier from the operation area to one of the first and second shunting areas, and the carrier is disengaged from this table, and is moved to the other shunting area for engagement with the other supply table which will be used, so that the latter table is moved to the operation area. In this case, it takes a lot of time for the supply tables to take turns supplying the components, resulting in lowered operating efficiency of the component supply device.

If the component supply device uses three or more supply tables, the size of each supply table can be made further smaller, and the supply device enjoys the effects as described above to a greater extent. In this case, the supply tables are successively moved from a pre-operation area to the operation area for supplying the components, and then moved from the operation area to a post-operation area after the supply of the components. However, the supply device still suffers from the problem of low operating efficiency, if the device uses only one carrier for conveying the supply tables between the above-indicated pre-and post-operation areas through the operation area.

SUMMARY OF THE INVENTION

It is therefore a first object of the present invention to provide a component supply device for supplying electronic components to a component mounting device, which employs at least three supply tables that can be moved at a relatively high speed with a relatively small drive force, and which permits the supply tables to readily and rapidly take turns supplying the electronic components.

It is a second object of the invention to provide such a component supply device as described above, which permits a setup or replacement operation of a supply table or tables while the supply device is continuously operating to supply the electronic components from the other supply table or tables.

The first object may be attained according the principle of the present invention, which provides a component supply device for supplying a component mounting device with electronic components at a supply position, so that the components are placed on a desired article by the component mounting device, which component supply device comprises (a) at least three supply tables each having a plurality of supply units mounted thereon such that the supply units have respective supply portions which are spaced from each other along a predetermined line, the supply units holding respective groups of electronic components of respective different kinds, and (b) guiding means for guiding the at least three supply tables such that the supply tables are movable in a moving direction parallel to the predetermined line. The guiding means extends in the moving direction over a predetermined distance covering an operation area which includes the supply position and in which the supply tables are successively positioned to transfer the electronic components to the component mounting device, and a pre-operation area and a post-operation area which are located adjacent to the operation area and on opposite sides of the operation area in the moving direction, respectively. The supply tables are successively accommodated in the pre-operation and post-operation areas before and after the supply tables are positioned in the operation area. The component supply device further comprises (c) table positioning means for positioning the above-indicated at least three supply tables in the moving direction so that the supply portions of the supply units are selectively brought to the supply position at which the electronic components of the corresponding one of the groups are received by the component mounting device. This table positioning means includes a first and a second carrier which are selectively engageable with the at least three supply tables and which are reciprocable in the moving direction without an interference with each other, to move the supply tables over the predetermined distance of extension of the guiding means. The table positioning means further includes a first and a second feeding device for moving the first and second carriers, respectively.

In the component supply device constructed as described above, the supply table placed in the pre-operation area is brought into engagement with one of the first and second carriers, and is moved to the operation area by the carrier, so as to supply the electronic components to the component mounting device. Since the instant supply device has the two carriers which are reciprocable without an interference with each other, one of the carriers may be used to move the supply tables from the pre-operation area to the operation area, while the other carrier may be reciprocated as needed between the post-operation area and the pre-operation area. During the supply of the electronic components from the above-indicated one supply table engaging the above-indicated one carrier, the other carrier may be brought into engagement with the supply table which is placed in the pre-operation area so that the supply table in the pre-operation area is set ready to go into the operation area for supplying the components. Upon completion of the supply of the components from the above-indicated one supply table, the supply table placed in the pre-operation area is immediately moved to the operation area so as to supply the electronic components, while the above-indicated one supply table is moved to the post-operation area. The above-indicated one carrier which has moved the supply table from the operation area to the post-operation area is disengaged from that supply table, and is moved back to the pre-operation area through the operation area, for engagement with the supply table which is placed in the pre-operation area.

In the present component supply device, three or more supply tables are fed in the moving direction to arrive at the operation area one after another, so as to supply the electronic components to the desired article such as a printed-wiring board. This arrangement provides reduction in the distance of movement of the supply tables, and permits accordingly improved operation efficiency of the supply device, as compared with the arrangement of the known supply device as disclosed in the above-identified publication. In this known device, during the supply of the components to a printed-wiring board, one of the two supply tables which has finished the component supplying operation in the operation area is moved to one of the two shunting areas which is downstream of the operation area in the moving direction, and the other supply table placed in the other shunting area is moved in the same direction to the operation area for the next component supplying operation. In this case, the above-indicated one supply table is moved to the above-indicated one shunting area by a distance almost equal to the length of each supply table. On the other hand, the above-indicated other supply table must be moved in the reverse direction by a distance almost two times the length of each supply table, for that other supply table to return from the operation area to the other shunting area. Further, the above-indicated one supply table must be moved by a distance almost two times the length of the supply table when that supply table is introduced from the above-indicated one shunting area into the operation area.

Where the supply tables are fed in one direction as in the present component supply device, the carriers need not to pass each other if the number of tables is equal to that of the carriers. When the three or more tables are used, and the number of the carriers are smaller than that of the tables, however, it is required that the carriers be reciprocable without an interference with each other.

Since the two carriers are reciprocable independently of each other without an interference with each other, one of the supply tables can be moved from the operation area to the post-operation area while another supply table is moved from the pre-operation area to the operation area. Thus, the supply tables can be successively brought to the operation area for supplying the components without intermission, thus enhancing the operating efficiency of the supply device. In addition, since the present supply device is provided with at least three supply tables, each supply table can be made relatively small-sized, which leads to increased moving speeds of each supply table, and accordingly improved operating efficiency of the supply device.

According to one preferred form of the present invention, the guiding means includes a plurality of parallel guide rails for guiding the above-indicated at least three supply tables, and the first and second feeding devices include a first and a second feed screw which engage the first and second carriers, respectively, and which are parallel to each other, and a first and a second drive source for rotating the first and second feed screws, respectively.

The guiding means may consist of an integrally formed guide device adapted to guide the supply tables from the pre-operation area to the post-operation area via the operation area. Alternatively, the guiding means may consist of three separate guide devices which provide the preoperation, operation and post-operation areas, respectively, and which are connected to each other so as to guide the tables over the predetermined distance covering the above-indicated three areas. Further, the guiding means may be adapted to guide the supply tables such that the tables cannot be removed from the guiding means, or such that the tables are removably installed on the guiding means.

Further, the instant component supply device may be provided with three or more carriers including the first and second carriers, for moving the supply tables along the guiding means. The use of three or more carriers makes it possible for the two or more supply tables to be positioned independently of each other within the operation area so as to concurrently supply the electronic components from these two or more supply tables. Generally, however, the number of the carriers may be smaller than that of the supply tables.

According to another preferred form of the invention, the component supply device further includes table returning means for returning the above-indicated at least three supply tables from the post-operation area to the pre-operation area, along a return path which is different from a path which consists of the predetermined distance of extension of the guiding means. In this arrangement, the supply table which has finished supplying the electrical elements in the operation area is moved to the post-operation area, and then returned to the pre-operation area through the return path. Thereafter, the supply table is moved from the pre-operation area, again into the operation area for the next supply of the components. That is, the supply tables are circulated along a continuous closed path which consists of the above-indicated predetermined distance covering the pre-operation, operation and post-operation areas, and the return path between the post-operation area and the pre-operation area. In this manner, the tables are successively moved to the operation area to supply the electronic components to the component mounting device. Accordingly, while the last one of the supply tables which has the set of electronic components to be placed last on one workpiece of the desired article is placed in the operation area, the first one of these supply tables may be accommodated in the pre-operation area, so that the first table can be moved to the operation area to initiate the component supplying operation for the next workpiece, immediately after the first supply table has finished the operation for the above-indicated one workpiece. Since a lot of supply units are usually mounted on each supply table, there is a sufficient time for each supply table to return to the pre-operation area during the supply of the electronic components from the preceding supply table placed in the operation area. In this manner, it is possible to immediately initiate the supply of the electronic components to the next workpiece, upon completion of the supply to the current workpiece.

Since the supply tables are circulated along the closed or endless path which consists of the pre-operation, operation and post-operation areas and the return path, the component supplying operation for one workpiece is immediately followed by the supplying operation for the next workpiece without an intermission or loss time, thereby permitting the instant supply device to operate with relatively high efficiency. Further, since the supply tables are fed by the table positioning means in one direction from the pre-operation area toward the post-operation area, the table positioning means can be easily controlled so as to successively position the supply portions of the supply units at the supply position of the component supply device.

The second object indicated above may be achieved according to a further preferred form of the invention, wherein a setup station is provided. The setup station shunts or branches from the return path. In this case, suitable means is provided for moving the at least three supply tables between the setup station and the return path. The above-indicated three supply tables may be are temporarily positioned on the setup station for effecting a setup operation on at least one of the supply units of the supply tables on the setup station. For example, the setup operation includes replacement of the supply unit or units each with a corresponding new one.

In the component supply device constructed as described above, the supply units on the supply tables can be replaced by a new set of supply units, on the setup station which shunts from the return path. The electronic components held by the new set of supply units may be the same as or different from the previously supplied electronic components. Because the supply tables on the setup station do not disturb movements of the currently used supply tables along the return path, the above replacement can be accomplished while the electronic components are supplied from the currently used supply tables. According to the present arrangement, the new set of supply tables which have been setup on the setup station can be introduced into the return path and used for supplying the new set of electronic components, immediately after the current component supplying operation is completed.

As described above, the supply units on the supply tables are replaced by new ones during the component supplying operation on the currently used supply table, thereby permitting significantly improved operating efficiency of the component supply device. Further, since the setup station is provided as an extension of the return path, the setup station disturbs neither the component supplying operation in the operation area of the table guiding means, nor the movements of the currently used supply tables from the post-operation area back to the pre-operation area along the return path.

BRIEF DESCRIPTION OF THE DRAWINGS

The foregoing and optional objects, features and advantages of the present invention will be better understood by reading the following detailed description of presently preferred embodiments, when considered in connection with the accompanying drawings in which:

FIG. 5a through FIG. 5m are explanatory views illustrating an example of the manner in which component supply tables are moved through the component supply device of FIG. 1;

FIG. 6a through FIG. 6i are explanatory views illustrating an example of the manner of replacing the component supply tables for changing setup of the component supply device.

DETAILED DESCRIPTION OF THE PREFERRED EMBODIMENTS

Figure 1:
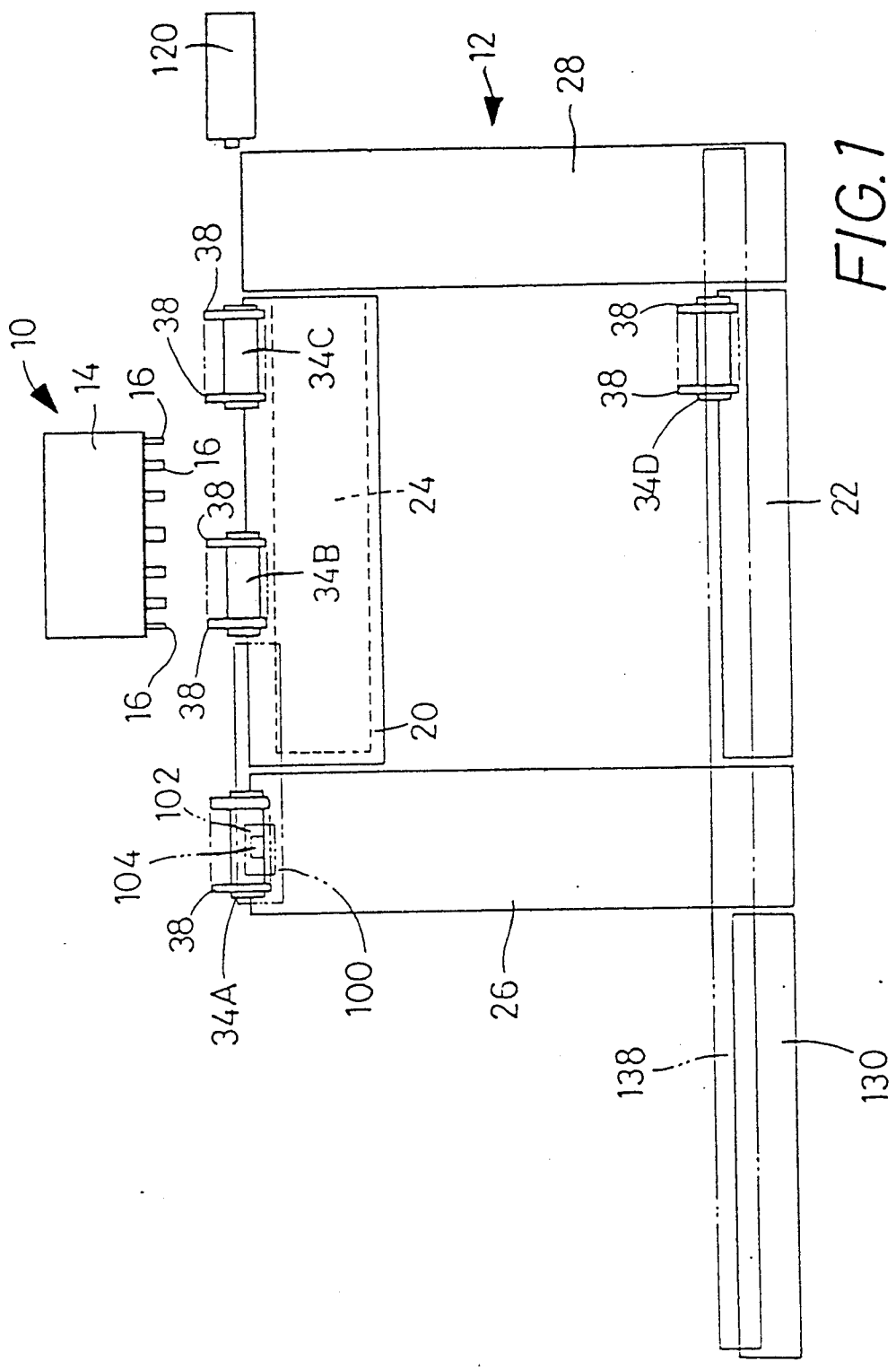
FIG. 1 is a schematic view showing a principal portion of a chip placing apparatus, which includes one embodiment of a component supply device of the present invention.

Referring first to FIG. 1, there is illustrated a part of a chip placing apparatus used for placing electronic ships or components on printed-wiring boards. The chip placing apparatus includes a component mounting device 10, and a component supply device 12 which is constructed according to the present invention. In this chip placing apparatus, the component mounting device 10 is adapted to pick up electronic components from the component supply device 12, so as to place the electronic components on a printed-wiring board which is transferred by a conveyer (not shown) along a transfer path from the right side to the left side as viewed in FIG. 1. The component mounting device 10 has an index table 14 disposed rotatably about the vertical axis thereof, and a plurality of placer heads 16 which are equally spaced apart from each other along a circle whose center lies on the axis of rotation of the index table 14. In operation, one of these placer heads 16 which communicates with a vacuum source operates to suck the electronic component which is placed at a supply position of the supply device 12. With the index table 14 being intermittently rotated, the placer heads 16 are successively stopped at a component pick-up position of the device 10 aligned with the supply position of the supply device 12 so as to pick up the electronic components, and are then stopped at appropriate mounting positions so as to place the electronic components on the printed-wiring board. Thus, the component mounting device 10 is capable of concurrently picking up one electronic component and placing another electronic component on the printed-wiring board, by operating the two placer heads 16 at the same time.

Figure 2:
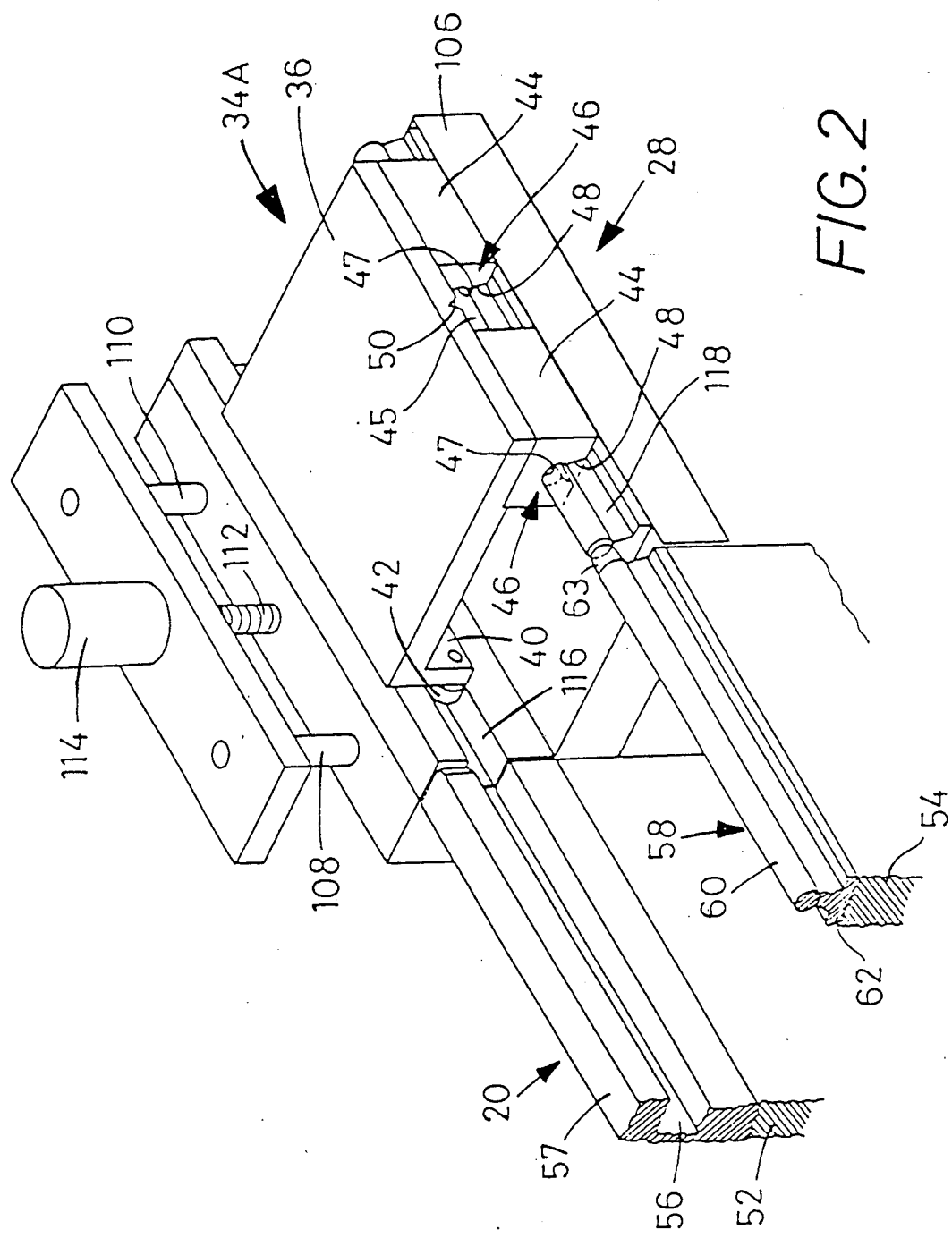
FIG. 2 is a perspective view showing principal parts of a first guide device and a table elevating device, which are incorporated in the component supply device of FIG. 1.

The component supply device 12 is disposed below the component mounting device 10, and includes guiding means in the form of a first guide device 20, positioning means in the form of a table positioning device 24, a second guide device 22, a table lowering device 26, and a table elevating device 28, as shown in FIG. 1. In this embodiment, the supply device 12 employs four supply tables 34A, 34B, 34C and 34D which are loaded with the electronic components to be supplied. Referring to FIG. 2, one of these supply tables 34A is illustrated by way of example. It is to be understood that the other supply tables 34B-34D have the same structure as the table 34A. The supply table 34A has a planar platform 36 for supporting a plurality of supply units 38 thereon such that the supply units 38 are arranged in the direction in which the table 34A is fed by the table positioning device 24, as described below. These supply units 38 are positioned and clamped on the table 34A by suitable positioning and clamping means. The supply units 38 are of the same type as disclosed in laid-open publication No. 61-162423 of unexamined Japanese Patent Application, which is assigned to the assignee of the present application. Briefly, each of the supply units 38 has a carrier tape which carries a multiplicity of electronic components of the same kind, so that the electronic components are supported by the carrier tape and covered by a covering tape such that the components are equally spaced apart from each other in the longitudinal direction of the carrier tape. Each time the carrier tape is fed by a suitable feeding device by a distance corresponding to the spacing between the adjacent electronic components, the cover tape is wound up and separated by the same distance by a take-up reel, and the leading electronic component on the carrier tape is positioned just below one of the placer heads 16 of the mounting device 10, so that the component can be sucked under vacuum by the placer head 16.

The supply units 38 have respective supply portions which are selectively brought into the supply position of the supply device 12 during feeding of the supply table 34A, so that the supply portion of the selected supply unit 38 is aligned with the placer head 16 in the component pick-up position. The supply units 38 are mounted on the platform 36 of each supply table 34A-34D, such that the supply portions of the units 38 are located along a straight line parallel to the direction of arrangement of the units 38. The supply tables 34A-34D have an appropriate number of supply units 38 which provide all kinds of electronic components needed for a certain type of a printed-wiring board. That is, the supply units 38 having the electronic components necessary for the relevant type of the printed-wiring board are divided into four groups mounted on the respective four supply tables 34A-34D. Since each table 34A-34D is required to be loaded with only one group of the units 38 as described above, the supply tables 34A-34D may be considerably small-sized. The supply units 38 on the tables 34A-34D have different kinds of electronic components, and are arranged on the tables 34A, 34B, 34C and 34D in the order in which the different kinds of electronic components are supplied to the component mounting device 10.

The supply table 34A as shown in FIG. 2 has a support wall 40 which extends downward from one of the opposite end portions of the platform 36 whose edges are parallel to the direction in which the supply portions of the supply units 38 are arranged in the spaced-apart relation. On the outer surface of this support wall 40, there are provided a pair of guide rollers 42 (one of which is shown in FIG. 2), such that the guide rollers 42 are rotatable about respective axes perpendicular to the direction of arrangement of the supply portions as described above. The supply table 34A further has two guide blocks 44 secured to the lower surface of the other end portion of the platform 36, such that the guide blocks 44 are spaced apart from each other to thereby define an opening 45 therebetween. These guide blocks 44 have respective keyholes 46 formed therethrough so as to extend in the direction parallel to that of arrangement of the supply portions of the units 38. Each keyhole 46 consists of a round hole 47, and a trapezoidal groove 48 which communicates with the round hole 47 and is open to the lower surface of the corresponding block 44. The platform 36 of the table 34A has a V-shaped notch 50 formed in the lower surface thereof, at its middle portion as viewed in the direction of arrangement of the supply portions of the units 38, such that the notch 50 extends over the entire width of the platform 36 in the direction perpendicular to the above-described direction of arrangement.

The first guide device 20 is disposed below the component mounting device 10, and has a suitable height from a floor surface on which the instant component supply device 12 is placed, as shown in FIG. 1. This first guide device 20 has a pair of support walls 52, 54 as shown in FIG. 2, which are vertically oriented and extend in the direction of transfer of the printed-wiring boards. To the upper end face of one of the support walls 52, there is secured a guide rail 57 having a guide groove 56 which is open toward the other support wall 54. The other guide rail 58 is secured to the upper end face of the other support wall 54. The guide rail 58 consists of a guide rod 60, and a trapezoidal base 62 for supporting the rod 60 thereon. The guide rod 60 has longitudinally opposite tapered ends 63 (only one of which is shown in FIG. 2), whose diameters gradually decrease in the longitudinally opposite directions of the rod 60. When the supply table 34A-34D is guided along the first guide device 20 in the direction parallel to that of the arrangement of the supply portions of the supply units 38, the guide rollers 42 of the table 34A-34D are rotated in rolling engagement with the guide groove 56 of the guide rail 57, while the guide blocks 44 of the table 34A-34D are slidably fitted on the guide rod 60 of the guide rail 58, with the guide rod 60 held in engagement with the keyholes 46 formed in the guide blocks 44. The guide groove 56 and the guide rail 58 have a longitudinal length sufficient to accommodate the four supply tables at a time. The first guide device 20 is positioned such that its longitudinally intermediate portion is located below the component mounting device 10, and has at that intermediate portion an operation area which can accommodate the two supply tables. In operation, an appropriate one of the supply tables 34A-34D is guided and positioned within the operation area of the device 20 for supplying the electronic components to the component mounting device 10. The first guide device 20 further has a pre-operation area and a post-operation area adjacent to the opposite ends of the operation area indicated above, i.e., on the opposite sides of the operation area. In FIG. 1, the pre-operation area and the post-operation area of the guide device 20 are respectively located at the right and left sides of the operation area. One of the supply tables 34A-34D which is ready to supply the electronic components to the mounting device 10 is positioned in the pre-operation area, while another of the supply tables 34A-34D which has passed through the operation area is located in the post-operation area after the supply of the electronic components by that supply table is completed.

Figure 3:
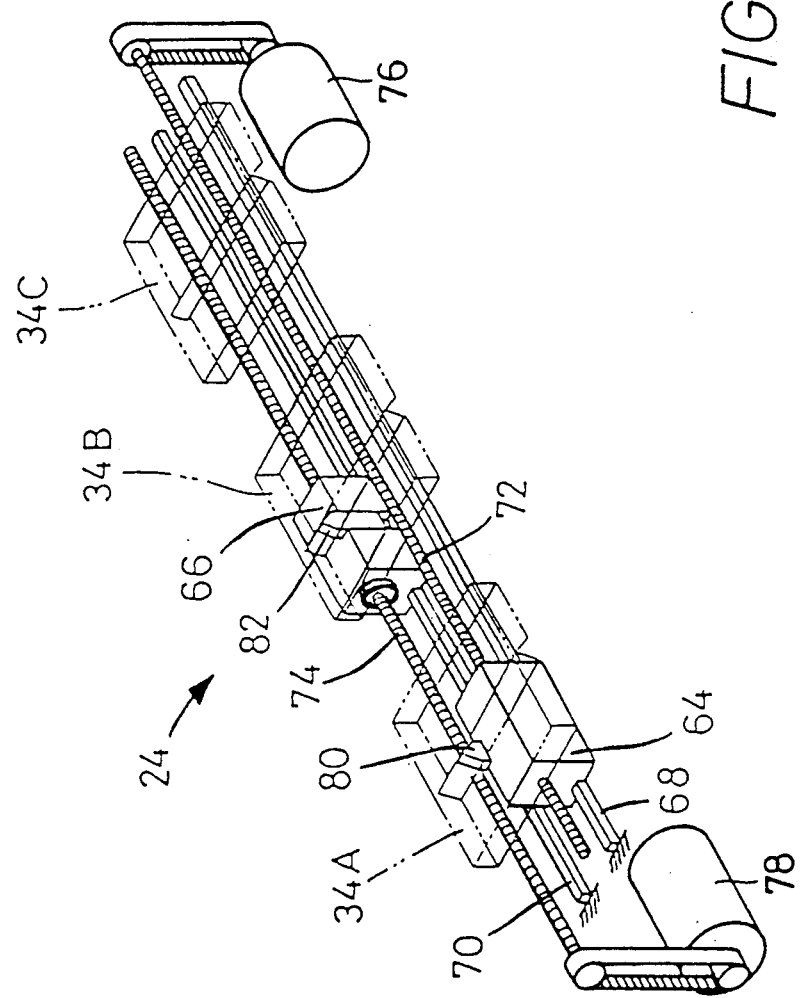
FIG. 3 is a perspective view showing a table positioning device incorporated in the component supply device of FIG. 1.

Between the support walls 52, 54 of the first guide device 20, the table positioning device 24 as shown in FIG. 3 is provided for feeding or positioning the supply tables 34A-34D. The table positioning device 24 has a first carrier 64 and a second carrier 66, which are slidably fitted on and guided by respective guild-rails 68, 70 extending parallel to the support walls 52, 54. The first and second carriers 64, 66 are held in engagement with respective feed screws 72, 74. The guide rails 68, 70 and the feed screws 72, 74 have a length ranging from the pre-operation area to the post-operation area of the first guide device 20, that is, a length which covers the entire length of the guide device 20. Further, the guide rail 68 and feed screw 72 supporting the first carrier 64 are spaced a suitable distance from the guide rail 70 and feed screw 74 supporting the second carrier 66, so that the first and second carriers 64, 66 can pass each other in the direction of movements while these carriers 64, 66 are mutually independently reciprocated through the pre-operation, operation and post-operation areas, with the feed screws 72, 74 rotated by respective drive motors 76, 78. The first and second carriers 64, 66 have respective engaging members 80, 82 fitted therein such that the members 80, 82 are slidable in the vertical direction. Each of the engaging members 80, 82 includes an upper end portions having a triangular cross section, which portion is adapted to engage the above-indicated V-shaped notch 50 of the supply table 34A-34D. In operation, these engaging members 80, 82 are elevated and lowered by respective elevators (not shown) provided in the carriers 64, 66, and are thus engaged with and disengaged from the notches 50 of the selected supply tables 34A-34D. In other words, each engaging member 80, 82 is selectively placed in an engaging position in which the member 80, 82 engages the notch 50 of the appropriate supply table 34A-34D, and in a retracted position in which the member 80, 82 is released from the notch 50. When the carriers 64, 66 are moved by the respective drive motors 76, 78 with their engaging members 80, 82 being engaged with the respective supply tables 34A-34D, these supply tables 34A-34D are moved along the straight line in which the supply portions of the supply units 38 on the tables 34A-34D are arranged. In this manner, the supply portions of the supply units 38 are successively brought into the supply position of the component supply device 12. As described above, one of the placer heads 16 of the component mounting device 10 is brought to the component pick-up position by the index table 14, just above this supply position of the supply device 12, so that the electronic component in the supply position is sucked up by the placer head 16 in the pick-up position. It will be understood from the above description that the feed screw 72 and the drive motor 76 constitute a first-carrier feeding device for positioning the first carrier 64, while the feed screw 74 and the drive motor 78 constitute a second-carrier feeding device for positioning the second carrier 66.

Figure 4:
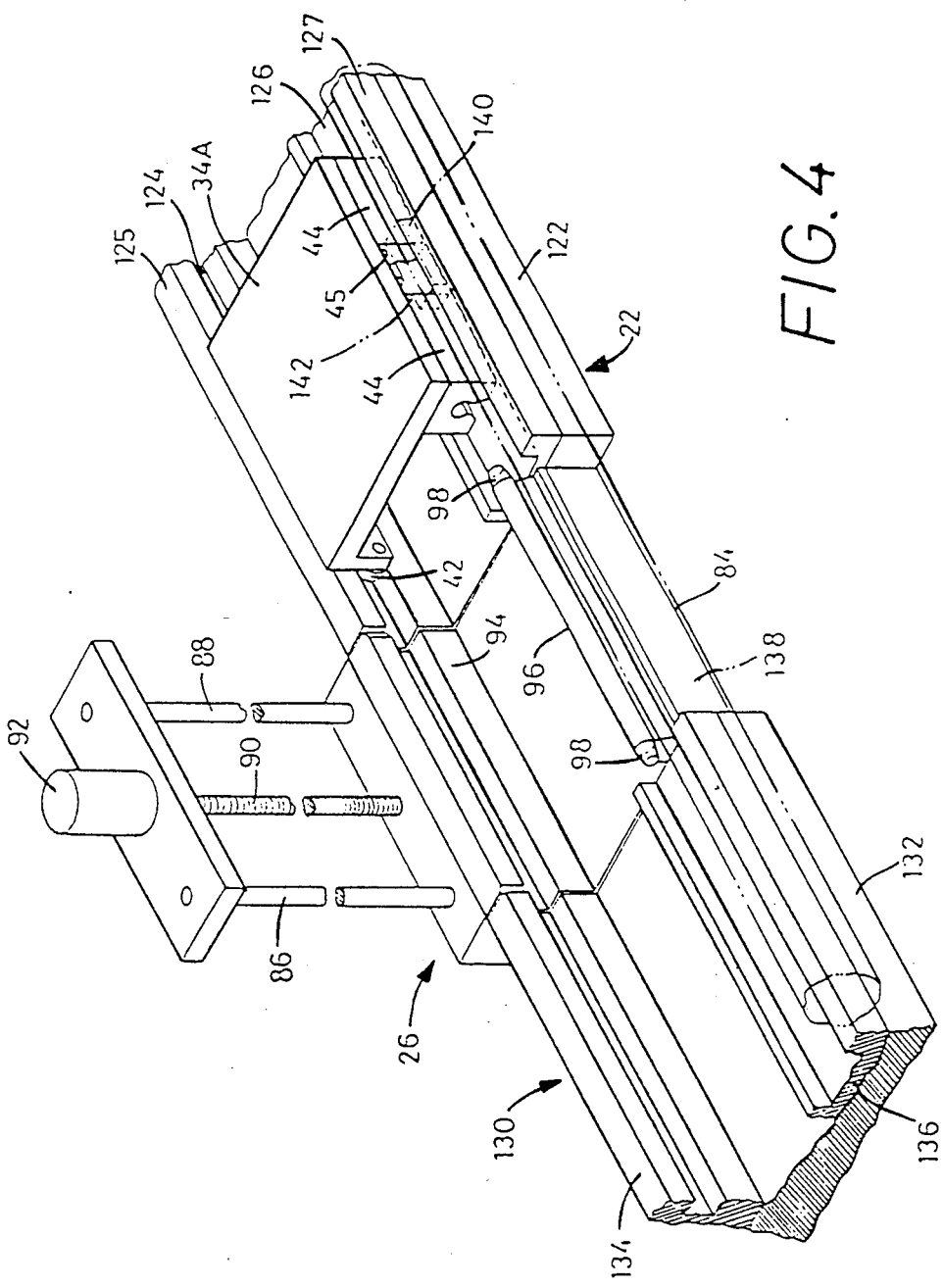
FIG. 4 is a perspective view showing principal parts of a second guide device, a table lowering device and a setup station, which are incorporated in the component supply device of FIG. 1.

The table lowering device 26 is disposed adjacent to the post-operation area of the first guide device 20, and includes a lifter 84 as shown in FIG. 4, for lowering the supply tables 34A-34D. The lifter 84 is slidably supported by two guide rods 86, 88 extending in the vertical direction, and is held in engagement with a feed screw 90 disposed between the guide rods 86, 88. With the feed screw 90 being rotated by a drive motor 92, the lifter 84 is elevated and lowered between the first guide device 20 and the second guide device 22. The lifter 84 has two guide rails 94, 96 having the same configurations and dimensions as the guide rails 57, 58 of the first guide device 20, respectively, such that the guide rails 94, 96 cooperate with the guide rails 57, 58 to constitute two continuous guide rails when the lifter 84 is elevated to its uppermost position. The guide rail 96 has opposite tapered ends 98 formed so that the supply tables 34A-34D can be smoothly guided between the lifter 84 and the first or second guide device 20, 22 or between the lifter 84 and a setup station 130 which will be described later.

Referring back to FIG. 1, the component supply device 12 has a table drawing device which includes a non-rod cylinder 100 extending over the post-operation area of the first guide device 20 and the upper end portion of the lowering device 26. The non-rod cylinder 100 is a pneumatic cylinder having no piston rod (available from Hohwa Machinery, Ltd.). This non-rod cylinder 100 has a piece which is moved along with a piston in the cylinder housing, and which protrudes outside of the housing while keeping airtightness of the interior of the housing. The piece of the non-rod cylinder 100 is engaged with a movable block 102 to which an engaging member 104 is attached. The engaging member 104 is selectively placed in two positions by a drive device (not shown) provided within the movable block 102, that is, in an engaging position in which the member 104 is fitted in the opening 45 between the guide blocks 44 of the supply table 34A-34D, and in a retracted position in which the member 104 is disengaged from the opening 45. When the piston of the non-rod cylinder 100 is pneumatically moved while the engaging member 104 is placed in the engaging position as described above, the supply table 34A-34D which engages the engaging member 104 is accordingly moved with the piston, between the post-operation area of the first guide device 20 and the upper end portion of the table lowering device 26.

Referring to FIG. 2, the table elevating device 28 is disposed adjacent to the pre-operation area of the first guide device 20, and includes a lifter 106 for elevating the supply tables 34A-34D. The lifter 106 is slidably supported by two guide rods 108, 110, and is held in engagement with a feed screw 112 disposed between the guide rods 108, 110. With the feed screw 112 being rotated by a drive motor 114, the lifter 106 is elevated and lowered between the first guide device 20 and the second guide device 22. The lifter 106 has two guide rails 116, 118 similar to the guide rails 57, 58 of the first guide device 20, such that the guide rails 116, 118 cooperate with the guide rails 57, 58, respectively, to constitute two continuous guide rails when the lifter 106 is elevated to its uppermost position. On one side of the table elevating device 28 which is remote from the first guide service 20, there is provided a horizontally oriented cylinder 120 (FIG. 1) for thrusting the supply table 34A-34D on the lifter 106 toward the first guide device 20.

The second guide device 22 is disposed below the first guide device 20, and between the lowering device 26 and the elevating device 28, as shown in FIG. 1. More specifically described referring to FIG. 4, the second guide device 22 has a bed 122 disposed parallel to the first guide device 20, and two guide rails 125, 127 which are respectively secured to the opposite side end portions of the bed 122, so as to extend in the direction parallel to the longitudinal direction of the bed 122. One of the guide rails 125 has a guide groove 124 which is open toward the other guide rail 126, while the guide rail 126 has a guide groove 127 which is open upward so that the guide blocks 44 of the supply table 34A-34D is slidably fitted in the guide groove 126. The lifters 84, 106 have their lowermost positions which are determined so that the guide rails 94, 96 of the lifter 84 and the guide rails 116, 118 of the lifter 106 cooperate with the guide rails 125, 127 of the second guide device 22 to constitute two continuous guide rails extending over these lifters 84, 106 and second guide device 22.

In the component supply device 12 constructed as described above, the supply tables 34A-34D which have left the post-operation area of the first guide device 20 may return to the pre-operation area of the device 20, through a descending path taken by the lifter 84, a guide path of the second guide device 22, and an ascending path taken by the lifter 106. In this embodiment, the descending path, guide path and ascending path constitute a return path of the supply tables 34A-34D, which connects the opposite ends of the first guide device 20.

On one side of the lowering device 26 remote from the second guide device 22, there is provided a setup or replacement area in the form of the setup station 130 as shown in FIG. 4, which is used when the supply tables 34A-34D are loaded with the electronic components or replaced by another set of supply tables. The setup station 130 has a bed 132 which is aligned with the extension line of the bed 122 of the second guide device 22, and two guide rails 134, 136 similar to the guide rails 125, 127 of the second guide device 22. The length of the setup station 130 is determined so as to permit four supply tables (34A-34D) to be accommodated on the setup station 130.

The component supply device further includes a non-rod cylinder 138 similar to the non-rod cylinder 100, which extends to cover the lengths of the second guide device 22, lowering device 26, elevating device 28 and setup station 130. Like the non-rod cylinder 100, the cylinder 138 has a piston which is operatively connected to a movable block 140 and an engaging member 142 attached to the movable block 140. While the engaging member 142 is fitted in the opening 45 between the guide blocks 44 of the supply table 34A-34D, the supply table 34A-34D is moved with the piston of the cylinder 138, between the setup station 130, and the lifter 84 and the second guide device 22, that is, between the station 130 and the return path as described above. It will be understood that the non-rod cylinder 138 serves as means for moving the supply tables 34A-34D between the setup station 130 and the return path. The non-rod cylinder 138 also serves to transfer the supply table 34A-34D from the second guide device 22 to the lifter 106 of the elevating device 28.

After one of the supply tables 34A-34D is moved by the non-rod cylinder 100 from the post-operation area of the first guide device 20 onto the lifter 84 of the lowering device 26, the supply table 34A-34D is lowered by the lifter 84 to the lowermost position thereof, and then moved to the lifter 106 through the second guide device 22, by means of the non-rod cylinder 138. Thereafter, the supply table 34A-34D is elevated by the lifter 106 of the elevating device 28 to the uppermost position thereof which is adjacent to the pre-operation area of the first guide device 20, and then thrusted into the pre-operation area by the cylinder 120. Thus, the lowering device 26, elevating device 28, second guide device 22, non-rod cylinders 100, 138 and cylinder 120 constitute means for moving the supply tables 34A-34D from the post-operation area to the pre-operation area of the first guide device 20.

Referring next to FIGS. 5a-5m, there will be described the manner of supplying electronic components by the instant component supply device 12. In FIGS. 5a-5m, the supply tables 34A, 34B, 34C and 34D are designated by the uppercase letters A, B, C and D, respectively, while the first and second carriers 64, 66 are designated by Roman numerals I and II, respectively. Further, rectangular boxes which are outlined by broken lines represent potential positions in which the supply tables 34A-34D may be located.

Figure 5A:
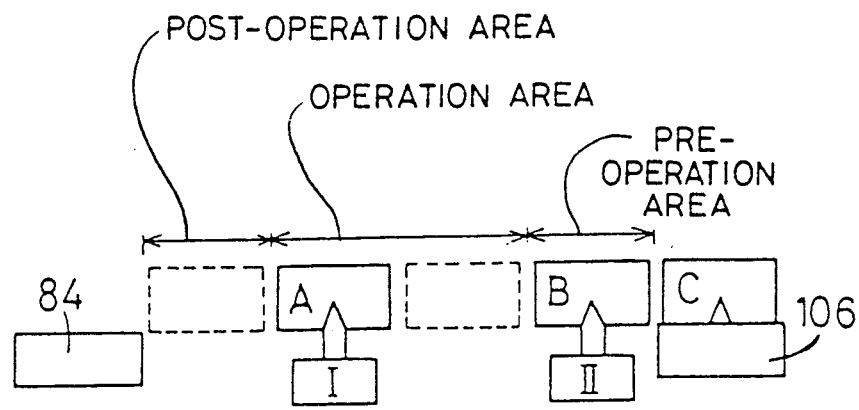
Figure 5B:
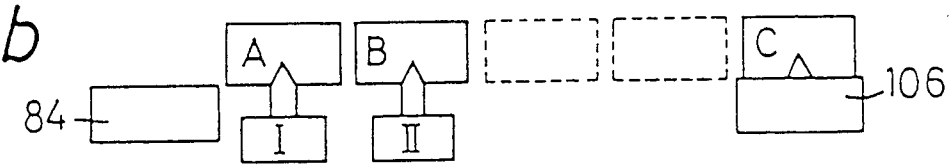
Figure 5C:
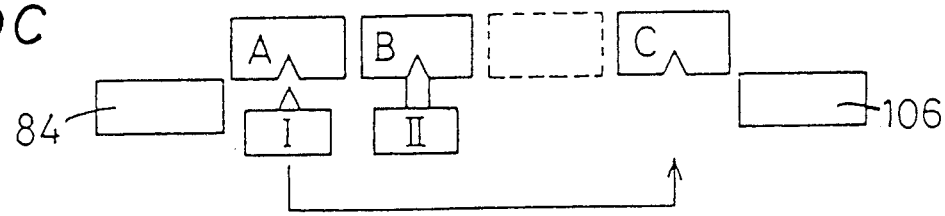
Figure 5D:
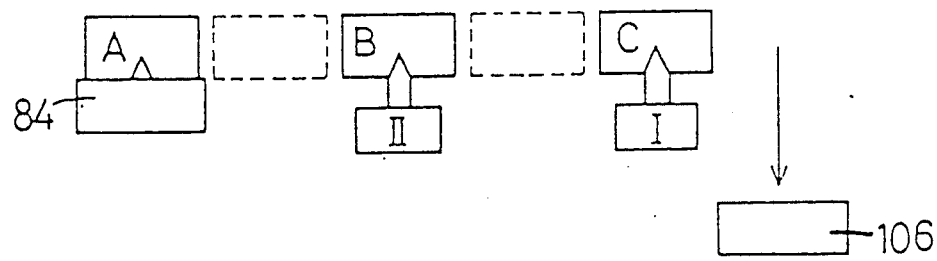
Figure 5E:
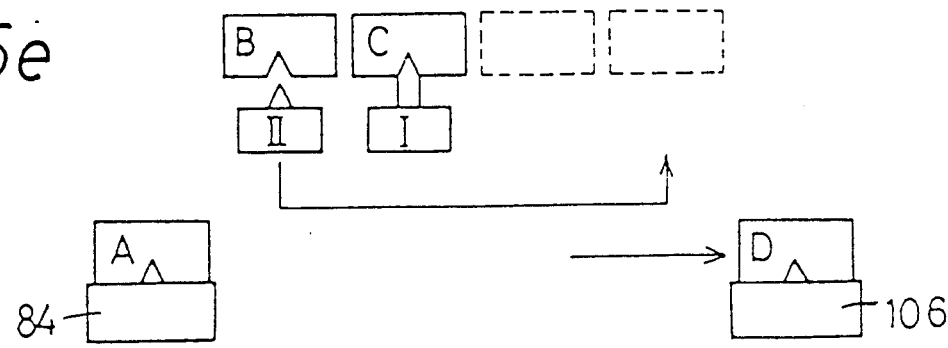

As shown in FIG. 5(a), the supply tables 34A and 34B are respectively located in the operation area and the pre-operation area of the first guide device 20, while the supply table 34C is located on the lifter 106 in the uppermost position of the elevating device 28. The supply table 34D which is not shown in FIGS. 5a-5m is located on the second guide device 22. In this condition, the first carrier 64 engages the supply table 34A, and the second carrier 66 engages the supply table 34B, as also shown in FIG. 5a. When the supply table 34A is moved by the first carrier 64, the supply portions of the supply units 38 on the table 34A are successively brought into the supply position of the component supply device 12, that is, the position just below one of the placer heads 16 which is placed in the component pick-up position, so that the mounting device 10 is supplied with the electronic components. Upon completion of the supply of the electronic components from the supply table 34A, the table 34A is moved to the post-operation area by the first carrier 64, as shown in FIG. 5b, while at the same time the supply table 34B is moved to the operation area so as to supply the electronic components from the table 34B. The table 34B may be moved to the operation area during the supply of the electronic components from the table 34A. While the mounting device 10 is supplied with the electronic components by the table 34B, the supply table 34C is moved to the pre-operation area, as shown in FIG. 5c. At the same time, the first carrier 64, more precisely, the engaging member 80 of the carrier 64 is released from the supply table 34A, and moved to the pre-operation area in which the table 34C is located. Then, the engaging member 80 of the carrier 64 is brought into engagement with the supply table 34C, as shown in FIG. 5d, and thus the supply table 34C is set ready to be introduced into the operation area. On the other hand, the supply table 34A which has been released from the first carrier 64 is transferred to the lifter 84 of the lowering device 26 by the non-rod cylinder 100, and then lowered to the lowermost position of the lifter 84, as shown in FIG. 5e. At the same time, the lifter 106 of the elevating device 28, from which the supply table 34C has been transferred to the pre-operation area, is lowered to its lowermost position.

When the component supply device 12 finishes supplying the electronic components from the supply table 34B, the table 34B is moved to the post-operation area, and the table 34C is moved to the operation area, as shown in FIG. 5e. As described above, the supply table 34C was engaged with the first carrier 64 during the supply of the electronic components from the table 34B, so that the table 34C can be immediately moved to the operation area upon completion of the supply from the table 34B. In this manner, the electronic components to be placed on the printed-wiring board are supplied from the supply tables 34A-34D without intermission. As is apparent from the foregoing description, the first or second carrier 64, 66 which has moved one of the supply tables to the post-operation area is disengaged from the above one supply table, and then is moved to the pre-operation area so as to engage another supply table which is located in that pre-operation area for subsequent use in the operation area. In this way, the supply table located in the pre-operation area can proceed to go to the operation area, immediately after a component pick-up operation on the supply table preceding this supply table is completed at the operation area.

Figure 5F:
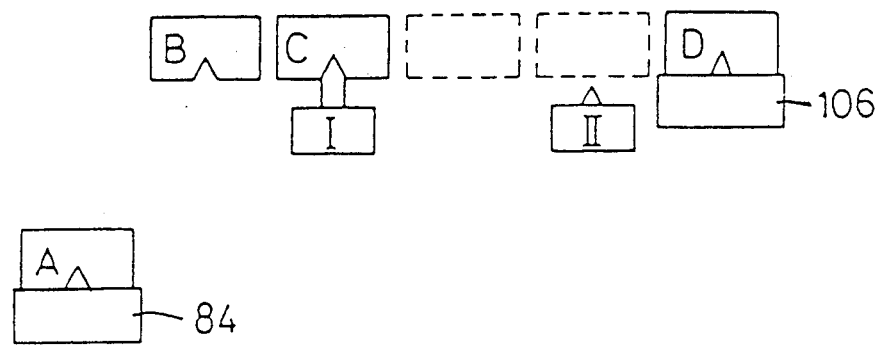
Figure 5G:
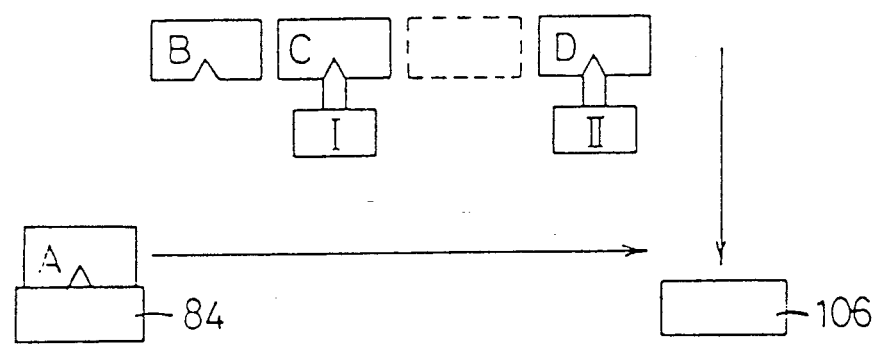
Figure 5H:
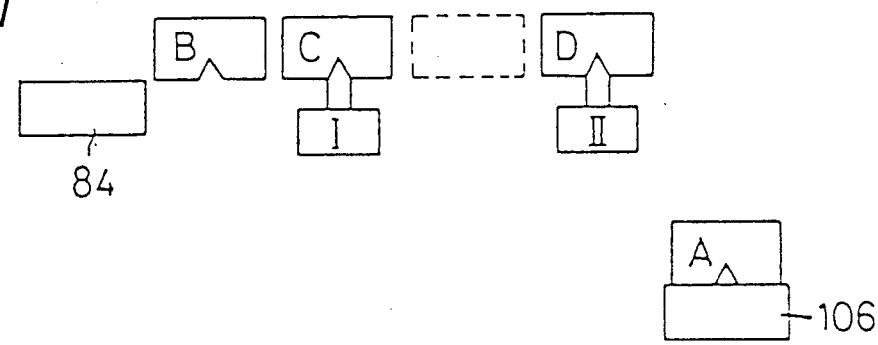
Figure 6I:
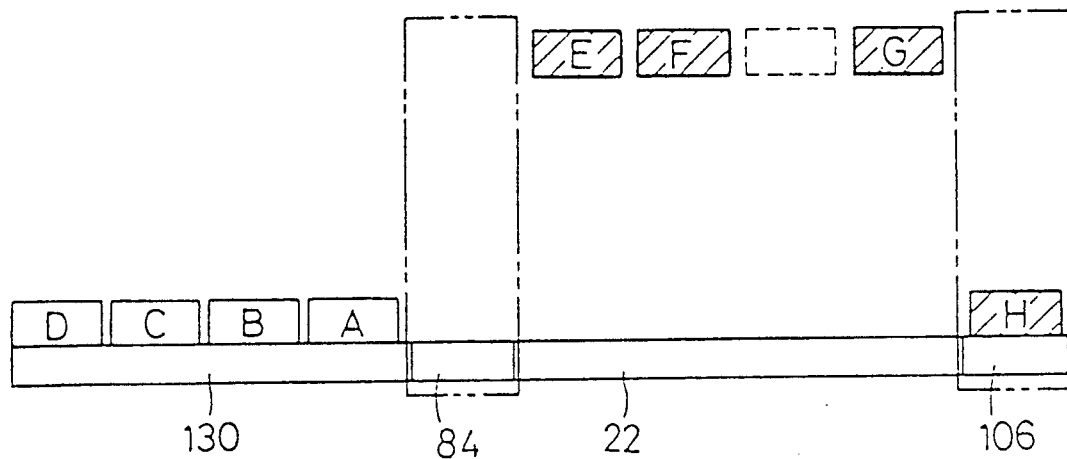

After the supply table 34C is transferred to the pre-operation area, and the lifter 106 of the elevating device 28 is lowered to its lowermost position, the supply table 34D is transferred from the second guide device 22 to the lifter 106, as shown in FIG. 5e. The lifter 106 which carries the table 34D thereon is elevated to its uppermost position, as shown in FIG. 5f, for subsequently transferring the table 34D to the pre-operation area on the first guide device 20. Subsequently, the lifter 106 is again lowered to the lowermost position so that the supply table 34A to be used next is transferred to the lifter 106, as shown in FIGS. 5g and 5h. The supply table 34A which is mounted on the lifter 106 is elevated by the elevating device 28 to the position adjacent to the pre-operation area of the first guide device 20, as shown in FIG. 5i. When the supply table 34D is introduced into the operation area for supplying the electronic elements, the supply table 34A is transferred to the pre-position area, as shown in FIG. 5j, and is brought into engagement with the first carrier 64, as shown in FIGS. 5k and 5l. Thus, the supply tables which have finished supplying the electronic components at the operation area return to the pre-operation area, along the return path as described above, which is different from the path along which the supply tables move from the pre-operation area to the post-operation area. Therefore, when the component supply device 12 accomplishes the supply of all the electrical elements to be placed on the first printed-wiring board, the supply table 34A is placed in the pre-operation area, and is thus prepared to proceed with an operation in the operation area for the second printed-wiring board, as shown in FIG. 5m. Similarly, the other supply tables 34B-34D are moved along the return path as described above, and are successively placed in the operation area so as to supply the electronic components for the second printed-wiring board.

Referring next to FIGS. 6a-6i, there will be described the manner in which the supply tables 34A, 34B, 34C and 34D are replaced by another set of supply tables 34E, 34F, 34G and 34H. It is to be understood that the supply of the electronic components from the supply tables 34E-34H is effected in the manner as described above. The first and second carriers 64, 66 are not shown in FIGS. 6a-6i, and no description about the movements of the carriers 64, 64 will be provided. That is, the following description is concerned with the movements of the supply tables 34A-34H in the component supply device 12, when the supply tables 34A-34D are replaced by the supply tables 34E-34H, according to a change in the type of the printed-wiring board on which the electronic components are mounted.

At first, the supply tables 34E-34H are loaded with a new set of electronic components, which is to be placed on a printed-wiring board of the type different from the printed-wiring board on which the electronic components are supplied from the supply tables 34A-34D. These supply tables 34E-34H are placed on the setup station 130 in the order of supply of the electronic components to the printed-wiring board, so that the table 34E which has the components to be supplied first is located nearest to the second guide device 22. After the supply of the electronic components on the table 34A is completed, and the table 34D is transferred to the lifter 106 of the elevating device 28, as shown in FIG. 6a, the tables 34E, 34F, 34G and 34H are transferred to the second guide device 22 in the order of description, as shown in FIG. 6b. At the same time, the lifter 106 which carries the table 34D thereon is elevated to its uppermost position from which the table 34D is transferred to the pre-operation area of the first guide device 20. Thereafter, the lifter 84 of the lowering device 26 is elevated to receive the table 34A, while the lifter 106 of the elevating device 28 is lowered to receive the table 34E, as shown in FIG. 6c. At the same time, the other tables 34F-34H are moved toward the elevating device 28, by a distance corresponding to one supply table, whereby a space corresponding to one supply table is provided on the left-hand side end portion of the second supply device 22, as viewed in FIG. 6c. After the lifter 84 of the lowering device 26 is lowered to its lowermost position, as shown in FIG. 6d, the supply table 34A on the lifter 84 is transferred to the above-described space on the second guide device 22, as shown in FIG. 6e. Then, the lifter 84 is elevated to receive the supply table 34B which has completed the supply of the electronic components.

The supply table 34C which has finished the supply of the electronic components is moved to the post-operation area, and the supply table 34D is moved to the operation area, while the supply table 34E is moved from the lifter 106 to the pre-operation area, as shown in FIG. 6f. Then, the lifter 106 of the elevating device 28 is again lowered so that the supply table 34F is mounted on the lifter 106, as shown in FIG. 6g. Consequently, the second guide device 22 is provided with the space for receiving the supply table 34B which is transferred from the lifter 84 of the lowering device 26.

Each time one of the supply tables 34A-34D is moved from the operation area to the post-operation area, the supply tables 34E-34H which still remain on the second guide device 22 are moved to the right by the distance corresponding to one supply table, and the leading supply table 34E-34H on the second guide device 22 is mounted on the lifter 106 of the elevating device 28, and the lifter 106 is elevated to the uppermost position thereof which is adjacent to the pre-operation area. In this way, the supply tables 34A-34D used for supplying the electronic components for the previous type of printed-wiring board are successively received by the second guide device 22, as shown in FIG. 6h. Then, these supply tables 34A-34D are transferred to the setup station 130, starting with the table 34D which is followed by the tables 34C, 34B and 34A in the order of description. In this arrangement, where the supply tables 34A-34D are used again for supplying the electronic components after the component pick-up operations on the tables 34E-34H are finished, the tables 34A-34D can be transferred to the second guide device 22 in the order starting with the table 34A. In such a case where the supply tables 34A-34D previously used for supplying the electronic components to a certain type of printed-wiring board are used again after the supply tables 34E-34H are used for supplying the components to another type of printed-wiring board, the supply units on the previously used supply tables 34A-34D may be replaced by new ones while these supply tables 34A-34D remain on the bed 132 of the setup station 130. If the numbers of the electronic components which are picked up from the supply units at the supply position of the supply device 12 differ depending upon the kinds of the electronic components, the numbers of the electronic components which remain in the supply units are different from each other. In this case, while the supply units with a relatively large number of electronic components left therein are not required to be replaced by new ones, only the supply units with no electronic components or a relatively small number of electronic components left therein are replaced by new ones, with the supply tables 34A-34D remaining on the bed 132 of the setup station 130. After the replacement of the appropriate supply units, the supply tables 34A, 34B, 34C and 34D are fed to the second guide device 22 in this order, when these tables 34A-34D are used again for supplying the electronic components to the printed-wiring board.

In the case where the supply tables 34A-34D are no longer used for the component supply device 12, these tables 34A-34D need not be temporarily placed on the second guide device 22 as shown in FIG. 6h. Namely, the tables 34A-34D which are successively lowered by the lifter 84 of the lowering device 26 are moved straight to the setup station 130, so that the supply units mounted on the tables 34A-34D are all replaced by another set of supply units for another type of printed-wiring board.

It will be understood from the above description that the instant component supply device 12 is provided with a replacement or setup area in the form of the setup station 130, which branches or shunts from the above-indicated return path of the supply tables 34A-34D. In this arrangement, the replacement of the supply units 38 on the tables 34A-34D can be easily and safely accomplished while the electronic components are supplied from the supply tables 34E-34H.

In the component supply device 12 of the instant embodiment, the first guide device 20, table positioning device 24, lowering and elevating devices 26, 28 and second guide device 22 are all supported on an integral frame structure, and this component supply device 12 can therefore be easily separated from the component mounting device 10 and other devices of the chip placing apparatus. That is, the component supply device 12 may be replaced by another type of component supply device, so as to obtain a desired chip placing apparatus. For example, the chip placing apparatus may employ a component supply device having only one carrier for positioning the supply tables, since it is not necessary to successively introduce the supply tables into the operation area without intermission if the situations permit a relatively long cycle time for a set of electronic components for one printed-wiring board.

Figure 7:
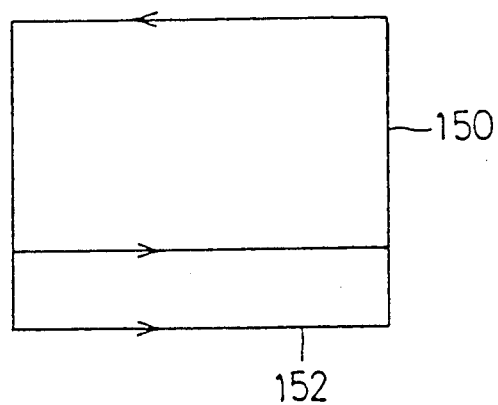
FIG. 7 is a schematic view showing another embodiment of the present invention.

The component supply device 12 of the instant embodiment is provided with the replacement or setup station 130, so that the supply tables are moved from the return path into the station 130, and from the station 130 into the return path, at the same position in the return path which corresponds to the lowermost position of the lowering device 26. However, a setup station 152 may be provided as a by-pass of the return path 150, as schematically shown in FIG. 7, so that the supply tables may be moved from the return path 150 into the by-pass setup station 152, and from the setup station 152 into the return path 150, at different positions in the return path 150. In this case, the supply tables are fed into the setup station 152 in the order in which the tables are fed into the operation area on the first guide device 20, and are fed from the setup station 152 in the same order when these supply tables are used again on the first guide device 20.

When the printed-wiring board on which the electronic components are placed is changed from one type to another, the supply tables used for the previous type of the printed-wiring board are moved from the return path into the setup station 130, as described above. This setup station 130 may also be used where the electronic components on the currently used supply tables run out during an operation on the same type of the printed-wiring board. For example, where the electronic components contained in part or all of the supply units loaded on one of the supply tables run out while the supply table is used for supplying the components, a substitute supply table loaded with a fresh set of supply units is delivered from the setup station 130 toward the second guide device 22 while the above supply table is fed from the operation area to the post-operation area. Then, the supply table whose supply units have been depleted is lowered by the lifter 84 of the lowering device 26, and fed into the setup station 130, while the substitute supply table is transferred from the device 22 to the pre-operation area of the first guide device 20. Where two or more of the supply tables run out of the electronic components, appropriate supply tables which are substituted for the depleted supply tables are moved into the second guide device 22, as in the above example. Subsequently, the depleted tables are temporarily once moved to the second guide device 22 one by one, and then moved into the setup station 130 in the order reversed to that in which these tables were moved to the device 22.

In the illustrated embodiment, the supply table 34A-34D which has finished its supply operation is once accommodated in the post-operation area of the first guide device 20, and then transferred onto the lifter 84 of the lowering device 26. The supply table 34A-34D lowered by the lifter 84 is then elevated by the lifter 106 of the elevating device 28, and is transferred to the pre-operation area so as to be ready for the next supply operation. However, the lowering and elevating devices 26, 28 may be disposed such that the uppermost position of the lifter 84 for lowering the supply table is in the post-operation area so as to directly receive the table in the post-operation area, while the uppermost position of the lifter 106 for elevating the supply table is in the pre-operation area so that the table is elevated by the lifter 106 directly to the pre-operation area. In this case, the guide rails of the lifters 84, 106 for guiding the supply tables and the guide rails of the operation area of the first guide device constitute guiding means for guiding the tables 34A-34D through the first guide device 20.

While the supply tables are adapted to circulate in the vertical plane in the illustrated embodiment, the tables may circulate in the horizontal plane.

In the illustrated embodiment, the guide rails for moving the supply tables through the first guide device 20 and the return path are provided by separate support structures. However, the guide rails may be provided by a single support structure which is commonly used for the table positioning device 24 and the means for returning the tables from the post-operation area back to the pre-operation area.

The supply tables are not necessarily circulated along a closed path as in the illustrated embodiment, but may be linearly reciprocated between the pre-operation area and the post-operation area so as to supply the electronic components. In this case, two or more supply tables which are necessary for supplying the electronic components may be accommodated in each of the pre-operation and post-operation areas. In operation, all of the supply tables are fed through the operation area in the same direction for supplying the electronic components. Then, the supply tables are returned from the post-operation area back to the pre-operation area, so that the supply tables are moved again from the pre-operation area to the operation area for supplying the electronic components to the next printed-wiring board. Alternatively, the supply of the electronic components to the printed-wiring board may be effected while the supply tables are moved alternatively on one or the other of the opposite directions, that is, in the forward direction for one printed-wiring board, and in the reverse direction for the following printed-wiring board. Namely, the direction of movements of the tables through the operation area for supplying the electronic components is switched each time an operation on one printed-wiring board is completed. In the reverse movements of the supply tables, the table positioning device 24 is controlled such that the supply units on each of the supply tables arrive at the supply position of the component supply device 12 in the same order as in the forward movements of the supply tables. However, this order of the supply units of each supply table may also be reversed by so controlling the table positioning device 12.

In the illustrated embodiment, the non-rod cylinder 100 is used for transferring the supply tables from the post-operation area to the lifter 84, while the non-rod cylinder 138 is used for feeding the tables from the lowering device 26 to the elevating device 28 through the second guide device 22. However, these non-rod cylinder 100, 138 may be replaced by suitable feeding devices, such as a band conveyor or a chain conveyor.

It is to be understood that the present invention is by no means limited to the details of the illustrated embodiments, but may be embodied with various other changes, modification and improvements which may occur to those skilled in the art, without departing from the scope and spirit of the present invention as defined in the appended claims.

What is claimed is:

1. A component supply device for supplying a component mounting device with electronic components at a supply position, so that the components are placed on a desired article by the component mounting device, said component supply device comprising, at least three supply tables each having a plurality of supply units mounted, thereon such that said supply units have respective supply portions which are spaced from each other along a predetermined line, said supply units holding respective groups of electronic components of respective different kinds;

guiding means for guiding said at least three supply tables such that said supply tables are movable in a moving direction parallel to said predetermined line, said guiding means extending in said moving direction over a predetermined distance covering an operation area which includes said supply position and in which said supply tables are successively positioned to transfer said electronic components to said component mounting device, and a pre-operation area and a post-operation area which are located adjacent to said operation area and on opposite sides of said operation area in said moving direction, respectively, said supply tables being successively accommodated in said pre-operation and post-operation areas before and after said supply tables are positioned in said operation area;

table positioning means for positioning said at least three supply tables in said moving direction so that said supply portions of said supply units are selectively brought to said supply position at which said electronic components of the corresponding one of said groups are received by said component mounting device, said table positioning means including a first and a second carrier which are selectively engageable with said at least three supply tables and which are reciprocable in said moving direction without an interference with each other, to move said supply tables over said predetermined distance of extension of said guiding means, said table positioning means further including a first and a second feeding device for moving said first and second carriers, respectively.

2. A component supply device according to claim 1, wherein said guiding means includes a plurality of parallel guide rails for guiding said at least three supply tables, and wherein said first and second feeding devices include a first and a second feed screw which engage said first and second carriers, respectively, and which are parallel to each other, and a first and a second drive source for rotating said first and second feed screws, respectively.

3. A component supply device according to claim 1, further comprising table returning means for returning said at least three supply tables from said post-operation area to said pre-operation area, along a return path which is different from a path consisting of said predetermined distance of extension of said guiding means.

4. A component supply device according to claim 3, further comprising a setup station which shunts from said return path, and means for moving said at least three supply tables between said setup station and said return path, said at least three supply tables being temporarily positioned on said setup station for effecting a setup operation on at least one of said supply units of the supply tables on said setup station, said setup operation including replacement of said at least one supply unit each with a corresponding new one.

5. A component supply device according to claim 3, wherein said table returning means comprises a table lowering device for lowering said at least three supply tables from a level of said post-operation area to a first lowered position, a table guiding device for moving said supply tables from said lowered position to a second lowered position, and a table elevating device for elevating said supply tables from said second lowered position to a level of said pre-operation area.

6. A component supply device according to claim 5, wherein said table lowering device has a first lifter which is movable to lower said at least three supply tables from said level of said post-operation area to said first lowered position, and a third feeding device for moving said first lifter.

7. A component supply device according to claim 6, wherein said first lifter is movable between an elevated position adjacent to said post-operation area and at said level of said post-operation area, and said first lowered position adjacent to one of opposite ends of said table guiding device.

8. A component supply device according to claim 5, wherein said table elevating device has a second lifter which is movable to elevate said at least three supply tables from said second lowered position to said level of said pre-operation area, and a fourth feeding device for moving said second lifter.

9. A component supply device according to claim 8, wherein said second lifter is movable between said second lowered position adjacent to one of opposite ends of said table guiding means, and an elevated position adjacent to said pre-operation area and at said level of said pre-operation area.

10. A component supply device according to claim 5, wherein said table returning means further comprises means for transferring said at least three supply tables from said post-operation area to said table lowering device.

11. A component supply device according to claim 5, wherein said table returning means further comprises means for transferring said at least three supply tables from said table lowering device to said table guiding device and to said table elevating device.

12. A component supply device according to claim 5, wherein said table returning means further comprises means for transferring said at least three supply tables from said table elevating device to said pre-operation area.

13. A component supply device according to claim 1, wherein said component mounting device includes an index table which is rotatable about an axis thereof, and a plurality of component placer heads which are selectively brought to a component pick-up position by rotation of said index table, said component pick-up position being aligned with said supply position of said component supply device.

* * * * *